United States Patent
Stock et al.

(10) Patent No.: US 10,366,596 B2
(45) Date of Patent: *Jul. 30, 2019

(54) MONITORING SYSTEM FOR ELECTRICAL EQUIPMENT FAILURE AND METHOD

(71) Applicant: SCADATA, INC., Fort Wayne, IN (US)

(72) Inventors: Kevin Stock, Fort Wayne, IN (US); Joe Ahdel, Fort Wayne, IN (US)

(73) Assignee: Scadata, Inc., Fort Wayne, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/022,848

(22) Filed: Jun. 29, 2018

(65) Prior Publication Data

US 2018/0322764 A1 Nov. 8, 2018

Related U.S. Application Data

(63) Continuation of application No. 15/458,637, filed on Mar. 14, 2017, now Pat. No. 10,013,865, which is a continuation of application No. 14/182,051, filed on Feb. 17, 2014, now Pat. No. 9,594,109.

(51) Int. Cl.
  *G08B 21/18* (2006.01)
  *H02H 1/00* (2006.01)
  *G01R 31/12* (2006.01)

(52) U.S. Cl.
  CPC ....... *G08B 21/185* (2013.01); *G01R 31/1209* (2013.01); *G08B 21/182* (2013.01); *H02H 1/0023* (2013.01)

(58) Field of Classification Search
  CPC .............. G08B 21/185; G08B 21/182; G01R 31/1209; G02H 1/0023
  See application file for complete search history.

(56) References Cited

U.S. PATENT DOCUMENTS

| | | | |
|---|---|---|---|
| 6,247,353 B1 * | 6/2001 | Battenberg | G01H 1/003 73/40.5 A |
| 6,446,027 B1 | 9/2002 | O'Keeffe | |
| 2010/0133922 A1 * | 6/2010 | Payack | H02H 5/12 307/328 |
| 2013/0271116 A1 * | 10/2013 | Javora | G01R 31/1254 324/114 |
| 2014/0278248 A1 * | 9/2014 | Whittle | G05B 23/0283 702/184 |

OTHER PUBLICATIONS

U.S. Appl. No. 15/458,637, filed Mar. 14, 2017.
U.S. Appl. No. 14/182,051, filed Feb. 17, 2014.

* cited by examiner

*Primary Examiner* — Sisay Yacob
(74) *Attorney, Agent, or Firm* — Barnes & Thornburg LLP

(57) ABSTRACT

A computerized monitoring system and method for detecting electrical equipment failure. The system includes a sensor that detects a sound level representative of ultrasonic emissions radiating from electrical equipment to be monitored. A computer system in communication with the sensor is programmed to determine whether the electrical equipment is experiencing one or more of arcing, tracking, or corona based on the sound level detected by the sensor. In some embodiments, the computer system continuously monitors for these conditions based on the sound level detected by the sensor.

15 Claims, 7 Drawing Sheets

MONITORING SYSTEM FOR ELECTRICAL EQUIPMENT FAILURE AND METHOD

RELATED APPLICATIONS

This application is a continuation of U.S. application Ser. No. 15/458,637 filed Mar. 14, 2017 (now U.S. patent Ser. No. 10/013,865) for a "Monitoring System for Electrical Equipment Failure and Method," which is a continuation of U.S. application Ser. No. 14/182,051 filed Feb. 17, 2014, (now U.S. Pat. No. 9,594,109) for a "Monitoring System for Electrical Equipment Failure and Method" which is hereby incorporated by reference in its entirety.

TECHNICAL FIELD

This disclosure relates generally to systems for detecting electrical equipment failure and more particularly to a system that monitors electrical equipment for arcing, tracking, and corona based on ultrasonic signals.

BACKGROUND AND SUMMARY

An arc-flash is a dangerous event in which a flashover of electrical current leaves its intended path and travels through the air from one conductor to another, or to ground. The result of an arc-flash incident is often a violent explosion, and when a person is in close proximity, can lead to serious injury or death. This possibility of arc-flash incidents creates a serious safety hazard.

Certain conditions, such as arcing, tracking, and corona, which produce the potential for arc-flash, can be detected before creating flashover or arc-flash incidents. Arcing, tracking, and corona emissions produce ionization. Ionization is a process by which a neutral atom or molecule loses or gains an electron(s), thereby acquiring a net charge, becoming an ion. Ionization has by-products: ozone and nitrogen oxides. These combine with moisture to produce nitric acid, which is destructive to most dielectrics and certain metallic compositions, resulting in corrosion. The object of electric condition monitoring is to detect the presence of these events before flashover occurs or before they produce an arc-flash incident when a cabinet is opened.

There have been attempts to detect these conditions. For example, infrared thermography detects heat generated by arcing and in most instances tracking; however, these types of detection systems will not sense corona. If cabinets housing the electrical equipment are enclosed, unless there is an IR test port, it is highly unlikely that infrared will detect the presence of these emissions. In addition, to view components within enclosed electrical cabinets, it is necessary to conform to National Fire Protection Agency ("NFPA") standards with regard to personal protective equipment ("PPE"); therefore, in many situations IR inspectors must wear cumbersome clothing and hoods and perform the required procedure to open cabinets for inspection. This can be very time consuming and, in hot weather, very uncomfortable.

While a great majority of the inspections around energized electrical equipment incorporate portable instruments, these inspections are limited in their ability to protect equipment from failure or from an arc-flash potential going undetected. The limitations are time based. If an inspector is testing at the time any of these incidents is occurring, there is a good chance they will be detected and reported for corrective action. But, unlike mechanical conditions which are usually detected first and then trended to specific action levels, once arcing, tracking, or corona are present, there is a potential for failure and arc flash that can occur at any time.

Therefore, there is a need for continuous on-line monitoring of enclosed electrical equipment. Ultrasound technology is ideally suited for detecting these emissions since the ionization process produces frequencies in the ultrasonic region. Ultrasonic instruments sense between 20-100 kHz and use heterodyning to translate the ultrasonic emissions into the audible range. These portable instruments provide information via headphones for the audio signal and on a meter to display intensity readings, usually in decibels. These hand-held devices often contain two sensing heads containing piezoelectric transducers: a scanning module for airborne sounds and a contact probe/wave-guide for structure borne signals.

In some embodiments, an electrical cabinet monitor or sensor is mounted on the internal side of a door or wall facing the components. Utilizing an airborne scanner, a threshold level can be set. If an event of arcing, tracking, or corona occurs, the sound level will be above the ambient threshold and be detected. An analog signal from the sensor is converted to a digital signal which is processed by the monitoring module executing on a computer. On-line monitoring provides several advantages. For example, it is not operator dependent and will continuously monitor. Whenever a condition occurs to produce the potential for arc flash or flashover, it will be sensed and alarmed instantly through the monitoring module.

According to one aspect, the present disclosure provides a computerized monitoring system for detecting electrical equipment failure. The system includes a sensor that detects a sound level representative of ultrasonic emissions radiating from electrical equipment to be monitored. A computer system in communication with the sensor is programmed to determine whether the electrical equipment is experiencing one or more of arcing, tracking, or corona based on the sound level detected by the sensor. In some embodiments, the computer system continuously monitors for these conditions based on the sound level detected by the sensor.

Depending on the circumstances, the computer system could send an alert message via a communications network responsive to detecting that the electrical equipment has experienced one or more of arcing, tracking, or corona based on the sound level detected by the sensor. By way of example, the alert message could be an email or a text message. This alert message could be sent to a pre-determined group of recipients.

In some cases, the system could include a plurality of sensors each operatively associated with respective electronic equipment, which allows multiple electrical cabinets to be monitored by the system, even if the electrical equipment is remote from each other. If the computer system detects that the sound level detected by at least one of the plurality of sensors exceeds a threshold sound level, alert message could be sent via a communications network. Depending on the circumstances, the alert message could include an identification of which sensor of the plurality of sensors detected a sound level that exceeds the threshold sound level.

According to another aspect, this disclosure provides a computerized monitoring system for detecting electrical equipment failure. The system a sensor configured to detect a sound level representative of ultrasonic emissions radiating from electrical equipment to be monitored. An interface device is provided in communication with the sensor that converts the sound level into computer-readable data. The system includes a non-transitory computer-readable medium having a computer program code stored thereon. A processor is in communication with the computer-readable memory and the interface device. The processor is configured to carry out instructions in accordance with the computer program code. When the computer program code executes, the processor is able to establish a threshold sound level using the sensor. The processor continuously queries the sensor to determine a current sound level, which allows a determination of whether the current sound level exceeds the threshold sound level. If so, an alert message is sent.

According to yet another aspect, this disclosure provides a computerized method of monitoring for electrical equipment failure. The method includes a step of establishing a threshold sound level using a sensor configured to detect a sound level representative of ultrasonic emissions radiating from electrical equipment to be monitored. The threshold sound level is representative of the electrical equipment operating in good working order. The sensor is periodically queried to determine a current sound level using a computer. Next, a determination is made using a computer whether the electrical equipment is experiencing one or more of arcing, tracking, or corona by comparing the current sound level with the threshold sound level.

Additional features and advantages of the disclosure will become apparent to those skilled in the art upon consideration of the following detailed description of the illustrated embodiment exemplifying the best mode of carrying out the disclosure as presently perceived. It is intended that all such additional features and advantages be included within this description and be within the scope of the disclosure.

BRIEF DESCRIPTION OF THE DRAWINGS

The present disclosure will be described hereafter with reference to the attached drawings which are given as non-limiting examples only, in which.

Figure 1:
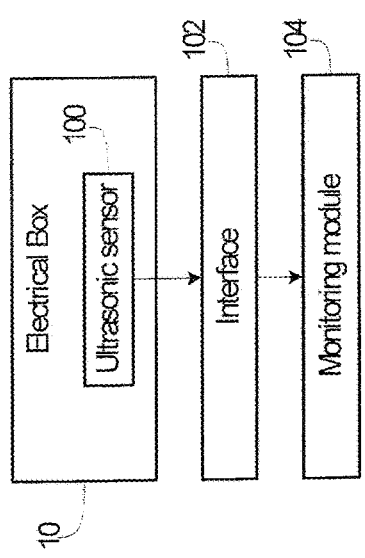
FIG. 1 is a diagrammatic view of an example monitoring system for detecting electrical equipment failure according to an embodiment of the present disclosure.

Corresponding reference characters indicate corresponding parts throughout the several views. The components in the figures are not necessarily to scale, emphasis instead being placed upon illustrating the principals of the invention. The exemplification set out herein illustrates embodiments of the invention, and such exemplification is not to be construed as limiting the scope of the invention in any manner.

DETAILED DESCRIPTION OF THE DRAWINGS

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the disclosure.

In one aspect, this disclosure provides a system of monitoring for electrical equipment failure. Under certain conditions, such as arcing, tracking, and corona, electrical equipment has the potential for arc flash. According to some embodiments, the present system is able to detect these conditions before flashover or arc-flash incidents by detecting the level of ultrasonic emissions radiating from the electronic equipment. The system can continuously monitor for these conditions—resulting in earlier detection than existing detection devices, such as infrared thermography. Depending on the circumstances, multiple locations of electrical equipment may be continuously monitored simultaneously. The term "continuously monitoring" as used herein does not require scanning the electrical equipment in an uninterrupted manner, but includes periodic scanning that occurs multiple times a day. Accordingly, an embodiment of the system that scans electrical equipment once every minute would still constitute "continuously monitoring" as that term is used herein even though the scanning does not occur in an uninterrupted manner.

FIG. 1 is a diagrammatic representation of an example monitoring system according to an embodiment of this disclosure. In this example, system includes an ultrasonic sensor 100, an interface device 102, and a monitoring module 104 resident on a computer. These devices 100, 102, 104 are configured to communicate with each other, such as through a wired connection or wireless connection.

The ultrasonic sensor 100 is mounted in an electrical box, such as a cabinet, that houses electrical equipment. For example, the ultrasonic sensor 100 could be mounted on the internal side of a door or wall of the cabinet facing the electrical equipment. The ultrasonic sensor 100 can be used to set a threshold sound level representative of ultrasonic emissions radiating from the electrical equipment in good working order. During monitoring, the ultrasonic sensor 100 can detect when an event of arcing, tracking, or corona occurs because the sound level will be above the ambient threshold. The following is a non-exhaustive list of example sensors that could be used in the system:

UE Systems, Inc.
14 Hayes Street
Elmsford N.Y. 10523 USA
Product Model Number: ECM 586
SmartSenseCom, Inc.
126 C Street NW
Washington, D.C. 20001
Product Model Number: SmartSenseCom MICROPHONE
(passive acoustic micro-sensor)
PCB Piezotronics, Inc.
3425 Walden Ave.
Depew, N.Y. 14043
Product Model Number: 130E20

In the example shown in FIG. 1, the system includes an interface 102, which converts an analog signal received from the ultrasonic sensor 100 into a digital signal and/or digital data that can be acquired by the computer system on which the monitoring module 104 is executing. Although the interface 102 is shown as a separate device from the ultrasonic sensor 100 in FIG. 1 for purposes of illustration, one skilled in the art should appreciate that the interface 102 could be integrated into the ultrasonic sensor 100 depending on the circumstances. The following is a non-exhaustive list of example interface devices that could be used in the system:

Scadata, Inc.
1315 E State Blvd
Fort Wayne, Ind. 46805
Product Model Number: RT4422D
Product Model Number: RT4422E
Allen Bradley
1201 South Second Street
Milwaukee, Wis. 53204-2496
Product Model Number: Compact Logix—L33ERM
Product Model Number: Micro Logix—1500
National Instruments Corporation
11500 N Mopac Expressway
Austin, Tex. 78759-3504
Product Model Number: Compact Rio—9024

The system includes a monitoring module 104, which processes the sensor data from the interface device 102 to determine whether the detected sound level is within the threshold level. If the sound level is outside the threshold level, the monitoring module 104 is configured to generate an alert message, which could take many forms. For example, the monitoring module 104 could send an alert in many possible forms, including but not limited to an email, text message, phone call with pre-recorded message, screen alert, etc. Depending on the circumstances, the monitoring module 104 could be configured to log the sensor data in a historical database.

Figure 2:
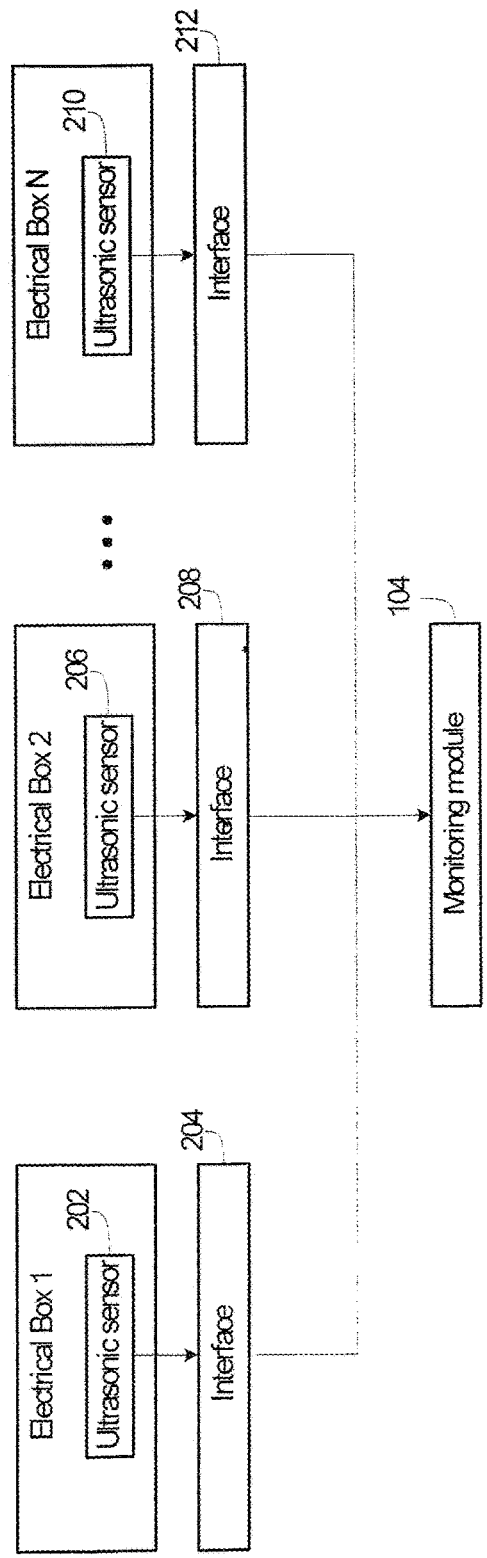
FIG. 2 is a diagrammatic view of an example system for monitoring a plurality of electrical equipment for failure according to an embodiment of the disclosure.

In some cases, such as the example shown in FIG. 2, the system may be used to monitor a plurality of electrical equipment at the same time. In the example shown, the system includes a first ultrasonic sensor 202 in proximity to sense sound levels of electrical equipment in Electrical Box 1. The first ultrasonic sensor 204 is connected with a first interface 204, which is in communication with the monitoring module. As shown, the system includes a second ultrasonic sensor 206 in proximity to electrical equipment in Electrical Box 2. The second ultrasonic sensor 206 is connected with a second interface 208, which is also in communication with the monitoring module. Additionally, an Electrical Box N is monitored with a third ultrasonic sensor 210, which is connected with a third interface 212. The monitoring module 104 is connected with the third interface 212 to determine whether the sound level of the electrical equipment in Electrical Box N is outside the threshold range. Depending on the circumstances, each of the sensors 202, 206, 210 could have a different threshold sound levels that cause the monitoring module 104 to generate an alert. Accordingly, if the monitoring module 104 determines that the sound detected is outside the sound threshold for any of the electrical equipment, an alert will be generated that could identify the particular electrical equipment with respect to the location of the electrical box. For example, if the monitoring module 104 determines the electrical equipment in Electrical Box 1 is outside the sound threshold for that electrical equipment, the monitoring module 104 could generate an alert that identifies that the alert relates to electrical equipment in Electrical Box 1.

Figure 3:
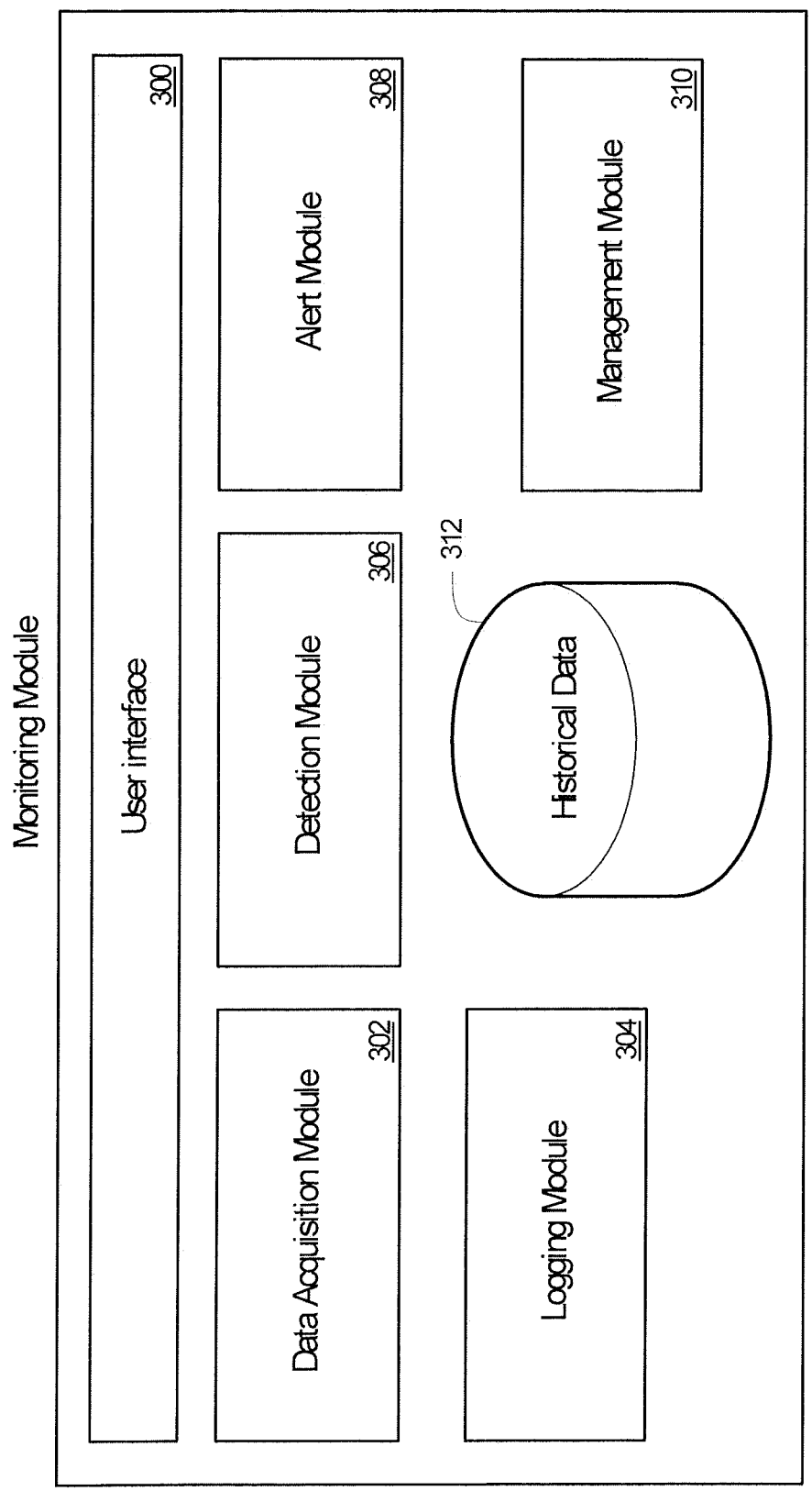
FIG. 3 is a block diagram showing modules of an example monitoring module according to an embodiment of the present disclosure.

FIG. 3 is a block diagram showing an embodiment with various modules that may be included in the monitoring module 104. In the embodiment shown, the monitoring module 104 includes a user interface 300, a data acquisition module 302, a logging module 304, a detection module 306, an alert module 308, a management module 310, and a historical database 312. Depending on the circumstances, the monitoring module 104 could be programmed using LabVIEW™ development platform offered by National Instruments Corporation of Austin, Tex. For the purposes of this specification, the term "module" includes an identifiable portion of computer code, computational or executable instructions, data, or computational object to achieve a particular function, operation, processing, or procedure. A module may be implemented in software, hardware/circuitry, or a combination of software and hardware. An identified module of executable code, for example, may comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Indeed, a module of executable code could be a single instruction, or many instructions, and may even be distributed over several different code segments, among different programs, and across several memory devices. Similarly, modules representing data may be embodied in any suitable form and organized within any suitable type of data structure. The data may be collected as a single data set, or may be distributed over different locations including over different storage devices.

The data acquisition module 302 is configured to communicate with the interface 102. The sensor data received by the data acquisition module 302 is stored and made available to other modules to perform various operations described herein. In some cases, for example, the data acquisition module 302 could communicate with the logging module 304 to store sensor data in a historical database 312, which could be useful for auditing purposes.

The detection module 306 is configured to compare the current sound level received from the data acquisition module 302 with the sound threshold to determine whether the current sound level is outside the sound threshold. If the current sound level is below the sound threshold, the detection module 306 has determined that no alert needs to be sent. However, if the current sound level exceeds the sound threshold, the detection module 306 would initiate an alert using the alert module 308. The alert module 308 is configured to generate an alert as discussed herein. In some cases, the alert module 308 could be configured with the desired form(s) of alert to be generated. For example, the user could select through the user interface 300 to have a text message and an email generated by the alert module 308. In some cases, the monitoring module 104 could include a management module 310 that can be used add/delete electrical equipment to be monitored to the system, configure communications between the various devices, and other management functions.

Figure 4:
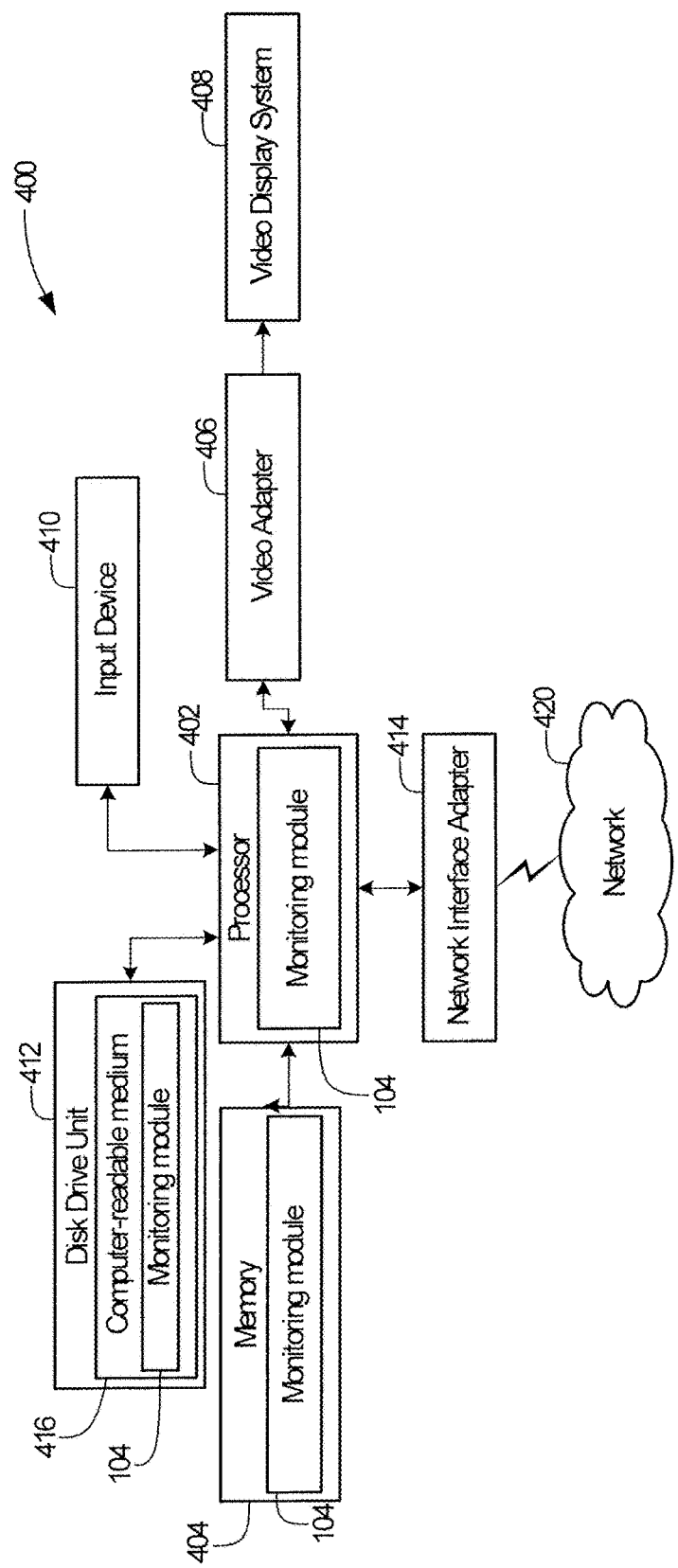
FIG. 4 is a block diagram showing an example system on which the monitoring module could be utilized according to an embodiment of the disclosure.

FIG. 4 illustrates a diagrammatic representation of a machine 400 in the example form of a computer system that may be programmed with the monitoring module 104. The machine may be a personal computer, a notebook computer, a server, a tablet computer, a personal digital assistant ("PDA"), a cellular telephone, or any machine capable of executing a set of instructions (sequential or otherwise) that specify actions to be taken by that machine. Although only a single machine is illustrated in FIG. 4, the term "machine" shall also be taken to include any collection of machines that individually or jointly execute a set (or multiple sets) of instructions to perform any one or more of the methods discussed herein.

The example machine 400 illustrated in FIG. 4 includes a processor 402 (e.g., a central processing unit ("CPU")), a memory 404, a video adapter 406 that drives a video display system 408 (e.g., a liquid crystal display ("LCD") or a cathode ray tube ("CRT")), an input device 410 (e.g., a keyboard, mouse, touch screen display, etc.) for the user to interact with the monitoring module 104, a disk drive unit 412, and a network interface adapter 414. Note that various embodiments of the machine 400 will not always include all of these peripheral devices.

The disk drive unit 412 includes a computer-readable medium 416 on which is stored one or more sets of computer instructions and data structures embodying or utilized by the monitoring module 104 described herein. The computer instructions and data structures may also reside, completely or at least partially, within the memory 404 and/or within the processor 402 during execution thereof by the machine 400; accordingly, the memory 404 and the processor 402 also constitute computer-readable media. As discussed above, the monitoring module 104 may communicate with the interface 102 over a network 420 via the network interface device 114 utilizing any one of a number of transfer protocols including but not limited to the hypertext transfer protocol ("HTTP") and file transfer protocol ("FTP").

The network 420 may be any type of communication scheme including but not limited to fiber optic, cellular, wired, and/or wireless communication capability in any of a plurality of protocols, such as TCP/IP, Ethernet, WAP, IEEE 802.11, or any other protocol. In some embodiments, for example, the monitoring module 104 could be accessed from a web server via the network 420 using a browser program, such as Internet Explorer™ by Microsoft Corporation of Redmond, Wash., or Safari™ by Apple Corp. of Cupertino, Calif.

While the computer-readable medium 416 shown in the example embodiment of FIG. 4 is a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing a set of instructions for execution by the machine and that cause the machine to perform any one or more of the methods described herein, or that is capable of storing data structures utilized by or associated with such a set of instructions. The term "computer-readable medium" shall accordingly be taken to include, but not be limited to, solid-state memories, optical media, flash memory, and magnetic media.

Figure 5:
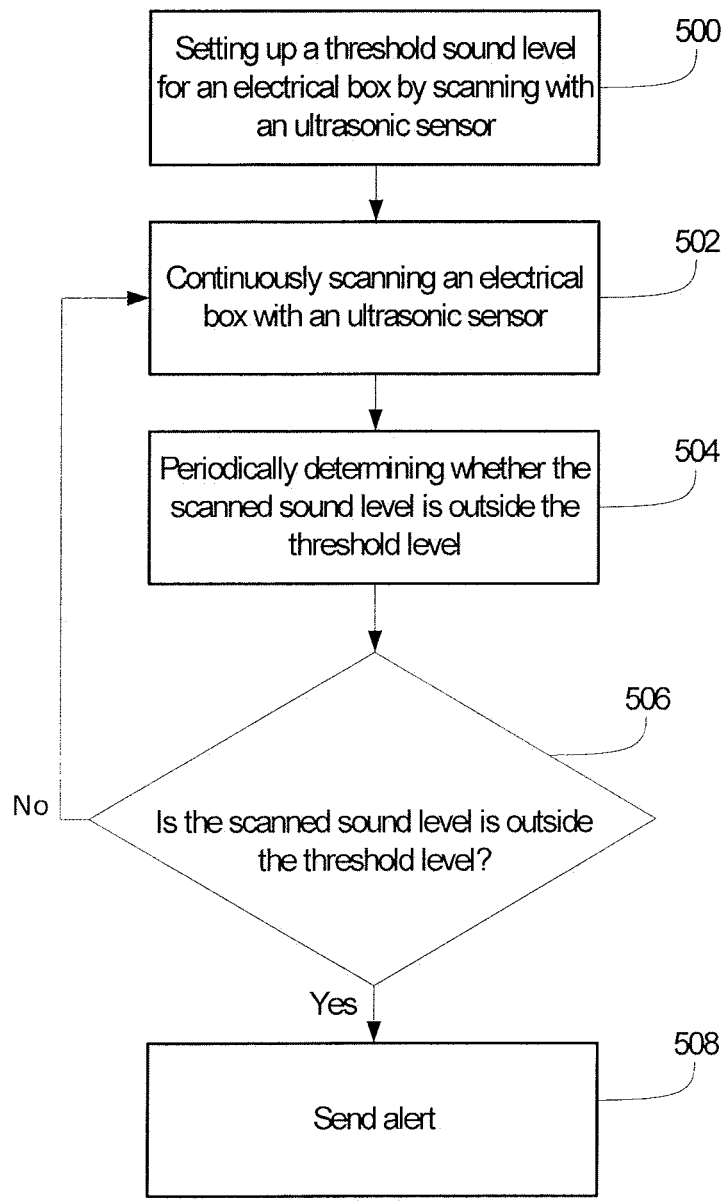
FIG. 5 is a flow chart showing example steps that could be made in a process according to an embodiment of the disclosure.

FIG. 5 is a flow chart showing possible actions that may be taken to monitor for electrical equipment failure by the system. The monitoring module 104 is configured to monitor and log data received from ultrasonic sensor(s) and interface(s) for regarding a plurality of electronic boxes being monitored. The monitoring module 104 provides the user with intuitive and flexible tools for configuring devices, control and viewing the status of an entire network, generating custom reports about the network and viewing custom trend graphs, to monitor historical data. The ability of a user to execute and modify these reports, trend graphs is based on login permissions. Users and their corresponding permissions fall into different user membership groups specified by developers or administrators.

Figure 6:
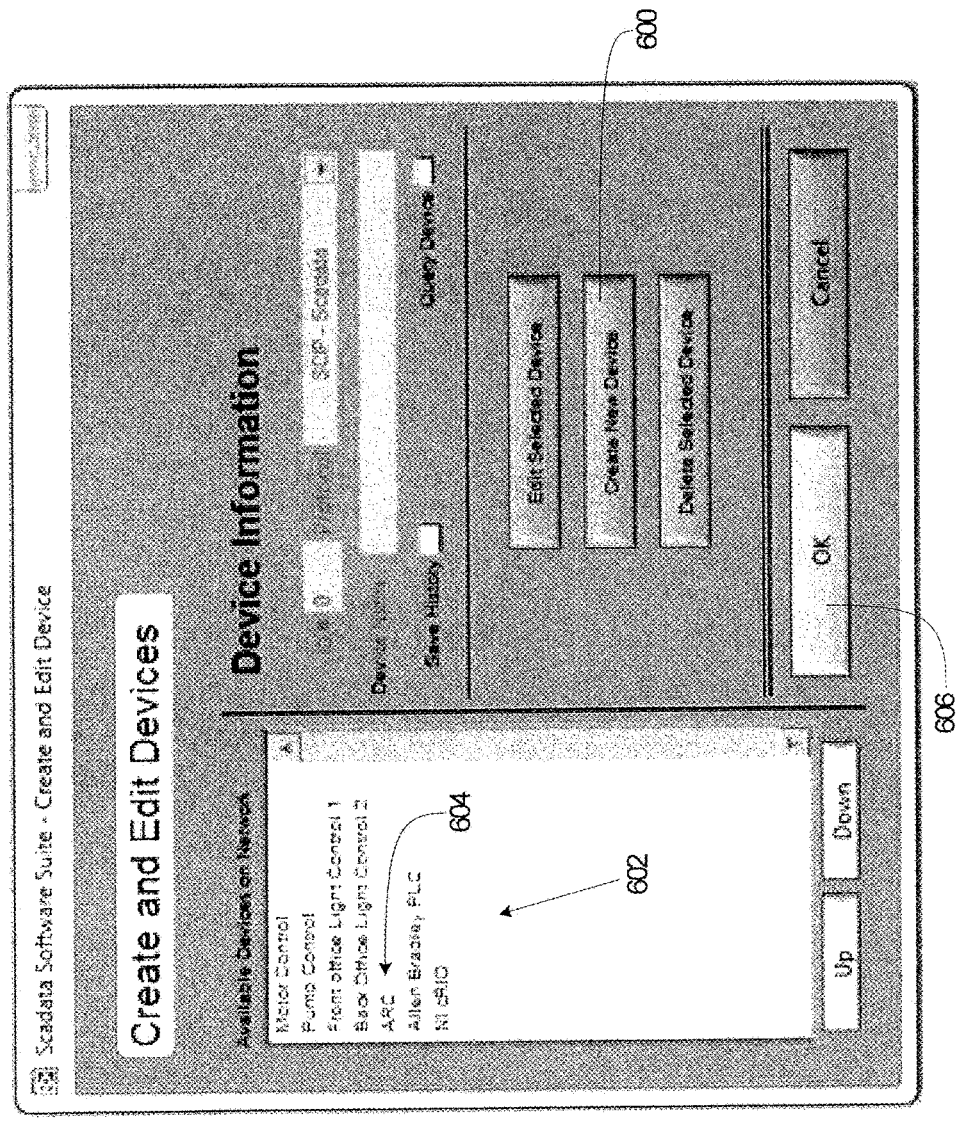
FIGS. 6-9 are example screen shots showing an example user interface for the personality assessment tool according to an embodiment of the present disclosure.

In some embodiments, the monitoring module 104 includes a user interface 300 from which the user can view various devices, such as ultrasonic sensor(s) and interface(s) on the network. For example, the interface shown in FIG. 6 could be used add an ultrasonic sensor or interface device to the network for monitoring. In this example, the user may select the "Create New Device" button 600 to select a new device from the list of available devices on the network 602. For example the "ARC" device 604 on the network could represent an ultrasonic sensor associated with an electrical box. Upon selecting a device to be added from the list, the user could select the "OK" button 606 in this example.

The device added to the network can be considered by the monitoring module 104. For example, the device could be configured with a name and values of tags. Tags are analog input and output channels and digital input and output channels that are available for the device. Each channel can have a custom name and no two names can be the same.

Figure 7:
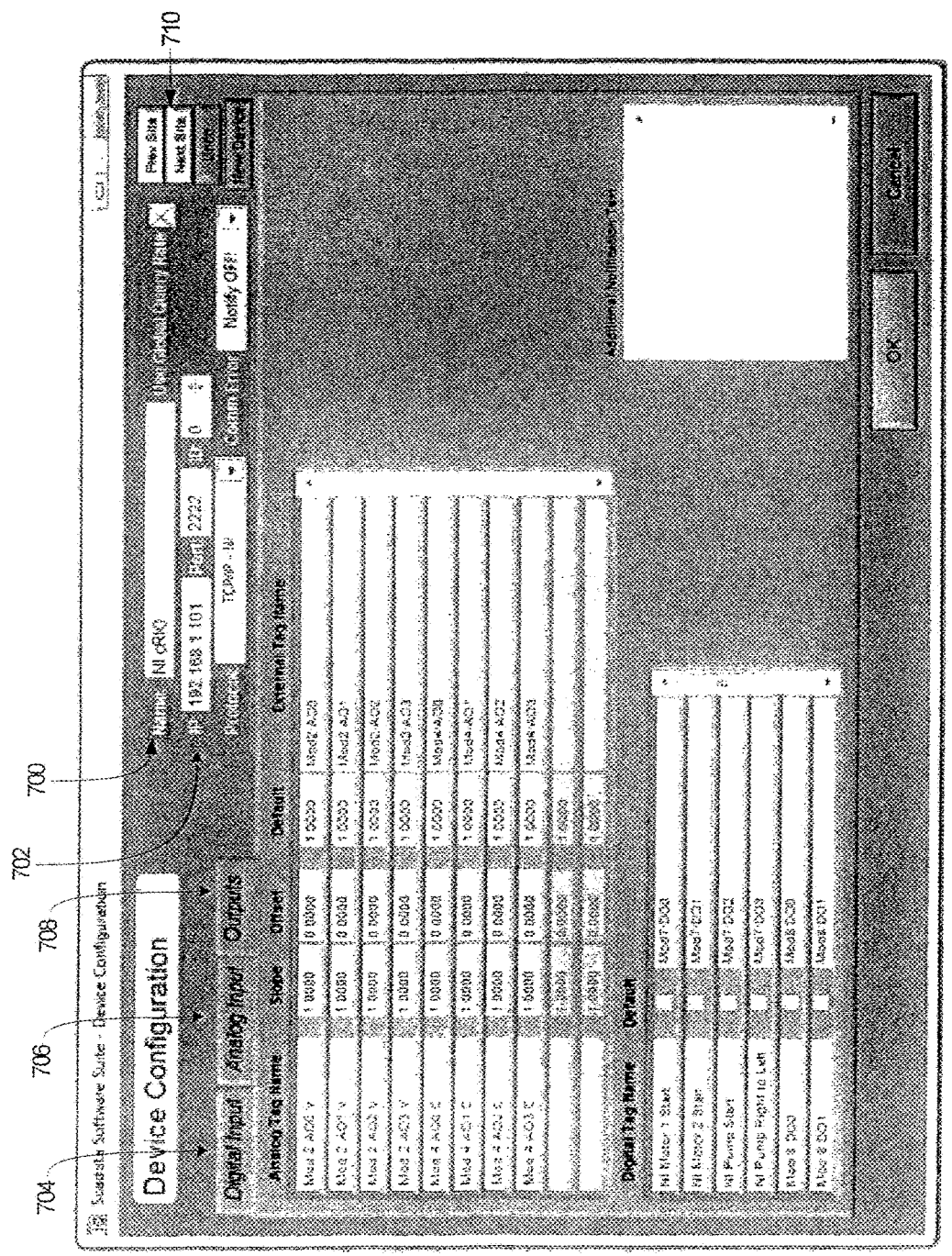

FIG. 7 shows an example interface for editing the configuration of a device on the network. In this example, the interface shows the device name 700 and network information 702 about the device. In some embodiments, the device name 700 can be any string of characters or an empty string if warranted. The protocol listed under the network information 702 selects the communication protocol that the device is using (e.g., Modbus, SCIP, ENET SCIP, Low Latency, NI DAQ—Shared Variables, OPC, or Ethernet/IP). When ENET SCIP is selected, the IP and Port define the address and port to which the system sends and receives SCIP messages to communicate with the device. OPC and Ethernet/IP are standard protocols. NI DAQ—Shared Variables and Low Latency are protocols used to communicate to National Instruments ("NI") hardware. NI DAQ—Shared Variables is used to communicate to a Shared Variables library, and Low Latency protocol requires a custom installation on the NI cRIO™. The Prey and Next buttons 710 can be used to step through each device that is configured without returning to the Device Create/Edit Screen.

The Query Rate input is used to configure the rate at which the device is queried. It specifies the amount of time between subsequent queries' for the individual device. As discussed above, queries of a device multiple times a day is considered "continuous" monitoring herein. The Use Global Query Rate checkbox is used to specify that the Device Query rate specified in the System Configuration is used for this device.

The example interface includes tabs for displaying and editing the digital input 704, analog input 706, and outputs 708, which is the selected tab shown in FIG. 7. From this interface, various configuration values and tags regarding the device can be viewed and edited. For Digital/Analog Inputs and Outputs, there is a column in which the user can enter an "external tag name." This can be thought of as a channel name and gives a name to the input or output that makes sense to the user. The external tag name could refer to the channel of the cRIO that is associated with the input/output (Mod1/AI0, Mod3/DO1).

Figure 8:
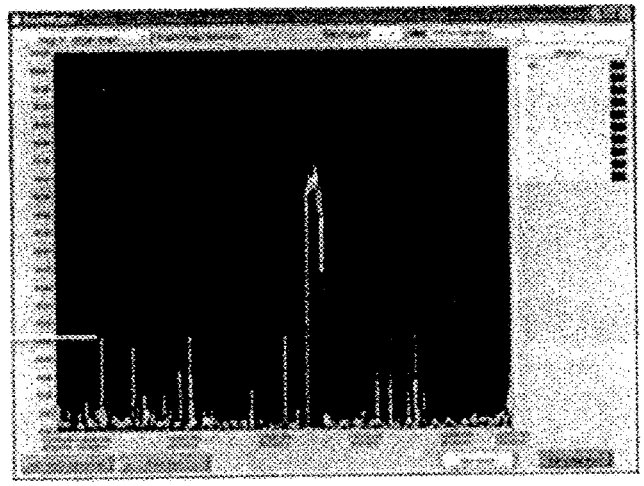
Figure 9:

With the ultrasonic sensor(s) and interface device(s) added to the interface, a threshold sound level can be established for each electrical device to be monitored (Block 500). As discussed above, the sound level of the electrical device increases under certain conditions, such as arcing, tracking, and corona. Accordingly, the monitoring module 104 can use the sound level to determine whether electrical equipment has the potential for arc flash. The monitoring module 104 periodically queries the ultrasonic sensor 100 through the interface 102, such as once a minute, which allows continuous scanning of the electrical box using the ultrasonic sensor 100 (Block 502). Upon receiving the current sound level data detected by the ultrasonic sensor 100, the monitoring module 104 compares the current sound level with the sound level threshold to determine whether it is outside the threshold level (Block 504). In some cases, the monitoring module 104 may be able to distinguish between types of conditions occurring at the electrical box, such as arcing, tracking, and corona, compared with arc flash. For example, the approximate sound levels (or amount by which the sound level exceeds the threshold) could be established for different conditions to determine the error occurring at the electrical box. FIGS. 8 and 9 show an example user interface that shows the sound levels being different between the partial discharge and an arc, respectively. Accordingly, the monitoring module 104 could be configured to distinguish between, in this example, a partial discharge and an arc.

Although the present disclosure has been described with reference to particular means, materials, and embodiments, from the foregoing description, one skilled in the art can easily ascertain the essential characteristics of the invention and various changes and modifications may be made to adapt the various uses and characteristics without departing from the spirit and scope of the invention.

What is claimed is:

1. A computerized method of monitoring for electrical equipment failure, the method comprising the steps of:
    establishing a threshold sound level based on a sensor mounted on an internal side of a door or wall of an electrical cabinet having electrical equipment to be monitored, wherein the threshold sound level is configured to detect one or more of arcing, tracking, or corona of electrical equipment to be monitored;
    querying the sensor to determine a current sound level;
    determining whether the current sound level exceeds the threshold sound level; and
    sending an alert message responsive to a determination that the current sound level exceeds the threshold sound level.

2. The method of claim 1, wherein the alert message is one or more of an email or a text message.

3. The method of claim 2, wherein the computer is configured to send the alert message to a pre-determined set of recipients.

4. The method of claim 1, wherein the sensor is configured to detect ultrasonic emissions between approximately 20 kHz to 100 kHz.

5. The method of claim 1, wherein in the establishing step, a plurality of threshold sound levels are established corresponding to a plurality of error conditions occurring at electrical equipment to be monitored including one or more of arcing, tracking, or corona.

6. The method of claim 5, wherein responsive to the current sound level exceeding any of the plurality of threshold sound levels, determining which error condition is occurring at the electrical equipment to be monitored based on which of the plurality of threshold sound levels have been exceeded.

7. The method of claim 6, wherein the alert message includes an identification of which error condition is occurring at the electrical equipment to be monitored.

8. A computerized method of monitoring for electrical equipment failure, the method comprising the steps of:
    displaying on a graphical user interface on a computer a plurality of objects that each represent a sensor mounted on an internal side of a door or wall of an electrical cabinet having electrical equipment to be monitored;
    establishing a threshold sound level using the sensors, wherein the threshold sound level is configured to detect one or more of arcing, tracking, or corona of electrical equipment to be monitored;
    querying one or more of the sensors to determine a current sound level;
    determining whether the current sound level exceeds the threshold sound level; and
    in response to the current sound level exceeding the threshold sound level, indicating in the graphical user interface which sensor exceeded the threshold sound level.

9. The method of claim 8, further comprising sending an alert message responsive to a determination that the current sound level exceeds the threshold sound level.

10. The method of claim 9, wherein the alert message is one or more of an email or a text message.

11. The method of claim 10, wherein the computer is configured to send the alert message to a pre-determined set of recipients.

12. The method of claim 8, wherein one or more of the sensors are configured to detect ultrasonic emissions between approximately 20 kHz to 100 kHz.

13. The method of claim 8, wherein in the establishing step, a plurality of threshold sound levels for one or more electrical cabinets are established, wherein the plurality of threshold sound levels correspond to a plurality of error conditions occurring at electrical equipment to be monitored in the respective electrical cabinets including one or more of arcing, tracking, or corona.

14. The method of claim 13, wherein responsive to the current sound level exceeding any of the plurality of threshold sound levels, determining which error condition is occurring at the electrical equipment to be monitored based on which of the plurality of threshold sound levels have been exceeded.

15. The method of claim 14, wherein the graphical user interface includes an identification of which error condition is occurring at the electrical equipment to be monitored.

* * * * *